US012009451B2

(12) United States Patent
Okandan et al.

(10) Patent No.: US 12,009,451 B2
(45) Date of Patent: Jun. 11, 2024

(54) IN-SITU RAPID ANNEALING AND OPERATION OF SOLAR CELLS FOR EXTREME ENVIRONMENT APPLICATIONS

(71) Applicant: mPower Technology, Inc., Albuquerque, NM (US)

(72) Inventors: Murat Okandan, Edgewood, NM (US); Kaveh Rouhani, Santa Clarita, CA (US)

(73) Assignee: mPower Technology, Inc., Albuquerque, NM (US)

( * ) Notice: Subject to any disclaimer, the term of this patent is extended or adjusted under 35 U.S.C. 154(b) by 989 days.

(21) Appl. No.: 16/526,644

(22) Filed: Jul. 30, 2019

(65) Prior Publication Data
US 2020/0035853 A1 Jan. 30, 2020

Related U.S. Application Data

(60) Provisional application No. 62/830,202, filed on Apr. 5, 2019, provisional application No. 62/711,979, filed on Jul. 30, 2018.

(51) Int. Cl.
*H01L 31/044* (2014.01)
*H01L 31/032* (2006.01)
(Continued)

(52) U.S. Cl.
CPC ........ *H01L 31/1864* (2013.01); *H01L 31/032* (2013.01); *H01L 31/042* (2013.01)

(58) Field of Classification Search
None
See application file for complete search history.

(56) References Cited

U.S. PATENT DOCUMENTS 3,490,965 A 1/1970 Wysocki
3,811,931 A 5/1974 Guillet
(Continued)

FOREIGN PATENT DOCUMENTS

CN 102097541 6/2011
CN 102157622 8/2011
(Continued)

OTHER PUBLICATIONS

"Industry-Specific Laser MicroJet Benefits", https://www.synova.ch/applications/semiconductors-photoviltaics.html, Apr. 23, 2017.
(Continued)

*Primary Examiner* — Dustin Q Dam
(74) *Attorney, Agent, or Firm* — Philip D. Askenazy; Peacock Law P.C.

(57) ABSTRACT

Method and apparatus for annealing micro-scale or macro solar cells that can contain lithium. Heaters, a current that is applied in forward or reverse direction, or open-circuiting the cells are used optionally with a laser or other light source to increase the temperature of the cells to perform periodic anneals to recover energy conversion efficiency lost due to environmental conditions such as radiation damage and maintain desired operational conditions. While a small amount of energy is used for heating up the small thermal mass of the micro-cells and macro cells to the desired annealing temperature, much larger amounts of additional energy is harvested with the improved efficiency of the cells. Maintaining a desired temperature for operation of cells takes very little energy owing to the small thermal mass of the cells and controlled thermal conduction of the materials in contact with the cells.

14 Claims, 8 Drawing Sheets

(51) Int. Cl.
*H01L 31/042* (2014.01)
*H01L 31/18* (2006.01)

(56) References Cited

U.S. PATENT DOCUMENTS

| | | | |
|---|---|---|---|
| 4,089,705 A | 5/1978 | Rubin | |
| 4,494,302 A * | 1/1985 | Knechtli | H01L 21/326 |
| | | | 136/246 |
| 4,608,452 A * | 8/1986 | Weinberg | H01L 31/0288 |
| | | | 438/953 |
| 4,633,031 A | 12/1986 | Todorof | |
| 4,677,742 A | 7/1987 | Johnson | |
| 4,805,006 A | 2/1989 | Yamaguchi et al. | |
| 5,374,935 A | 12/1994 | Forrest | |
| 5,407,491 A | 4/1995 | Freundlich et al. | |
| 5,444,249 A | 8/1995 | Wong | |
| 5,457,322 A | 10/1995 | Kitaguchi et al. | |
| 5,730,808 A | 3/1998 | Yang et al. | |
| 5,733,382 A | 3/1998 | Hanoka | |
| 5,961,738 A * | 10/1999 | Benton | H02S 30/20 |
| | | | 136/251 |
| 6,262,358 B1 | 7/2001 | Kamimura et al. | |
| 6,288,325 B1 | 9/2001 | Jansen et al. | |
| 6,490,477 B1 | 12/2002 | Zylka et al. | |
| 6,909,098 B2 | 6/2005 | Bross et al. | |
| 7,567,649 B1 | 7/2009 | Safai et al. | |
| 8,879,688 B2 | 11/2014 | Safai | |
| 8,994,137 B2 | 3/2015 | Padinger | |
| 9,116,249 B1 | 8/2015 | Claus et al. | |
| 9,141,413 B1 | 9/2015 | Cruz-Campa et al. | |
| 9,511,393 B2 | 12/2016 | Safai | |
| 9,559,229 B2 | 1/2017 | Chen | |
| 2002/0146868 A1 | 10/2002 | Miyasaka | |
| 2003/0155516 A1 | 8/2003 | Spartiotis et al. | |
| 2003/0173523 A1 | 9/2003 | Vuorela | |
| 2009/0071528 A1 | 3/2009 | Chen | |
| 2009/0288702 A1 | 11/2009 | Kim | |
| 2010/0082171 A1 | 4/2010 | Takehara et al. | |
| 2010/0243036 A1 | 9/2010 | Herguth et al. | |
| 2010/0275990 A1 | 11/2010 | Shimomura et al. | |
| 2010/0282293 A1 | 11/2010 | Meyer et al. | |
| 2010/0283612 A1 | 11/2010 | Wong et al. | |
| 2010/0327171 A1 | 12/2010 | Robinson et al. | |
| 2011/0005570 A1 | 1/2011 | Jain | |
| 2011/0209744 A1 | 9/2011 | Hu | |
| 2011/0277835 A1 | 11/2011 | Masson et al. | |
| 2011/0290296 A1 | 12/2011 | Daniel et al. | |
| 2012/0000502 A1 | 1/2012 | Wiedeman et al. | |
| 2012/0145231 A1 | 6/2012 | Woods et al. | |
| 2012/0265975 A1 | 10/2012 | Kimelman | |
| 2013/0048861 A1 | 2/2013 | Oyhta et al. | |
| 2013/0154394 A1 * | 6/2013 | Mildenstein | G05F 1/46 |
| | | | 307/131 |
| 2013/0161772 A1 | 6/2013 | Chan et al. | |
| 2013/0206199 A1 * | 8/2013 | Lassiter | H01L 31/0547 |
| | | | 136/206 |
| 2013/0206219 A1 | 8/2013 | Kurtin et al. | |
| 2013/0213462 A1 | 8/2013 | Lewis et al. | |
| 2013/0264669 A1 | 10/2013 | Li et al. | |
| 2013/0269747 A1 | 10/2013 | Lentine et al. | |
| 2013/0314236 A1 | 11/2013 | Warren | |
| 2013/0344645 A1 | 12/2013 | Ahmari et al. | |
| 2014/0004651 A1 | 1/2014 | Fogel et al. | |
| 2014/0060616 A1 | 3/2014 | Okandan et al. | |
| 2014/0102531 A1 | 4/2014 | Moslehi | |
| 2014/0166066 A1 | 6/2014 | Hennessy et al. | |
| 2014/0203392 A1 | 7/2014 | Li et al. | |
| 2014/0266289 A1 | 9/2014 | Della Sera et al. | |
| 2014/0334601 A1 | 11/2014 | Shizukuishi | |
| 2015/0111333 A1 | 4/2015 | Wenham et al. | |
| 2015/0114444 A1 | 4/2015 | Lentine et al. | |
| 2015/0114451 A1 | 4/2015 | Anderson et al. | |
| 2015/0131187 A1 | 5/2015 | Krein et al. | |
| 2015/0228810 A1 | 8/2015 | Shumate et al. | |
| 2015/0280025 A1 | 10/2015 | Bellanger et al. | |
| 2015/0311371 A1 | 10/2015 | Krishnamoorthy | |
| 2015/0349176 A1 | 12/2015 | Morad et al. | |
| 2015/0349703 A1 | 12/2015 | Morad et al. | |
| 2016/0015350 A1 | 1/2016 | Chang | |
| 2016/0268455 A1 | 9/2016 | Levy et al. | |
| 2016/0359637 A1 | 12/2016 | Okandan | |
| 2016/0380143 A1 | 12/2016 | Hekmatshoartabari et al. | |
| 2017/0200762 A1 | 7/2017 | Okandan et al. | |
| 2017/0330992 A1 | 11/2017 | Liau et al. | |
| 2017/0358041 A1 | 12/2017 | Forbes, Jr. et al. | |
| 2019/0363200 A1 * | 11/2019 | Höft | H02S 40/36 |

FOREIGN PATENT DOCUMENTS

| | | | |
|---|---|---|---|
| CN | 105023921 | 11/2015 | |
| DE | 19956878 A1 * | 6/2001 | H01L 31/0543 |
| EP | 0109176 | 5/1984 | |
| KR | 2010043654 | 4/2010 | |
| KR | 101395048 B1 * | 5/2014 | |
| KR | 20180095413 A | 8/2018 | |

OTHER PUBLICATIONS

"Stealth Dicing Technology and Applications", https:/www.hamamatsu. com/resources/pdf/etd/SD_tech_TLAS9004E.pdf, Mar. 2005.
Bollier, David, "The Blockchain: a Promising New Infrastructure for Online Commons", http://bollier.org/blog/blockchain-promising-new-infrastructure-online-commons, Mar. 4, 2015, 1-2.
Kerr, M. J., et al., "Surface recombination velocity of phosphorus-diffused silicon solar cell emitters passivated with plasma enchanced chemical vapor deposited silicon nitride and thermal silicon oxide", Journal of Applied Physics, vol. 39, No. 7, American Institute of Physics, Apr. 1, 2001, 3820-3826.
Kim, Ho Kyung, et al., "Cascade Modeling of Pixelated Scintillator Detectors for X-Ray Imaging", IEEE Transactions on Nuclear Science, vol. 55, No. 3, Jun. 2008, 1367-1366.
Entine, Anthony L., et al., "Optimal Cell Connections for Improved Shading, Reliability, and Spectral Performance of Microsystem Enabled Photovolutaic (MEPV) Modules", Presented at 35th IEEE PVSC Conference, Jun. 20-25, 2010.
Nikolic, Rebecca J., et al., "Fabrication of Pillar-Structured Thermal Neutron Detectors", 2007 IEEE Nuclear Science Symposium Conference Record, 2007, 1577-1580.
Shen, C. C., et al., "Two-terminal Monolithic InP/InGaAsP Tandem Solar Cells with Tunneling Intercell Ohmic Connections", Conference Record of the Twenty Second IEEE Photovoltaic Specialists Conference, Oct. 7, 1991, 381-387.
Statler, R. L., "Radiation damage and annealing of lithium-doped silicon solar cells", JPL Proc. of the 4th Ann. Conf. on Effects of Lithium Doping on Silicon Solar Cells, Sep. 15, 1971, 91-98.
Thompson, et al., "LIPS III-burst anneal solar array experiment", Proceedings of the 24th Intersociety Energy Conversion Engineering Conference, IEEE, 1989.
Weinberg, et al., "Increased radiation resistance in lithium-counterdoped silicon solar cells", Appl. Phys.Lett., vol. 44, No. 11, 1984, 1071-1073.

* cited by examiner

Thermoelectric Device/layer

IN-SITU RAPID ANNEALING AND OPERATION OF SOLAR CELLS FOR EXTREME ENVIRONMENT APPLICATIONS

CROSS-REFERENCE TO RELATED APPLICATIONS

This application claims priority to and the benefit of the filing of U.S. Provisional Patent Application No. 62/711,979, entitled "In-Situ Rapid Anneal and Operation of Solar Cells for Extreme Environment Applications", filed on Jul. 30, 2018, and U.S. Provisional Patent Application No. 62/830,202, entitled "In-Situ Rapid Anneal and Operation of Solar Cells for Extreme Environment Applications", filed on Apr. 5, 2019, the specification and claims of which are incorporated herein by reference.

BACKGROUND OF THE INVENTION

Field of the Invention (Technical Field)

The present invention is related to in-situ, in-operation annealing of solar cell structures to recover performance lost due to environmental and operational conditions such as radiation exposure and other damage. The energy used to perform the annealing process is minimal and enhances energy production, since the improved photovoltaic efficiency provides over 10 times more power than the amount of power used for the annealing.

Background Art

Note that the following discussion may refer to a number of publications and references. Discussion of such publications herein is given for more complete background of the scientific principles and is not to be construed as an admission that such publications are prior art for patentability determination purposes.

Ambient annealing of solar cells and radiation detectors is well-known behavior, observed during operation of these devices. It is also known that when these devices are heated to elevated temperatures, some of the damage accumulated in these devices can be annealed leading to recovery of a portion of the energy conversion efficiency that was lost. Some previous proposals have been made to anneal solar cells used for space applications during operation, but the operational and system configuration complexities have prevented utilization of this approach. Damage to such cells is caused by energetic particles and high energy photons that are incident on the cells in the space environment, leading to displacement of atoms and creation of defects. These defects then cause trapping and recombination of photo-generated carriers, which reduce the efficiency of the cells. When additional energy is available to anneal these defects, either by changing physical configuration, such as allowing hydrogen in the structure to bind and passivate the defect, or cause hydrogen to leave the defect, or rearrangement of bonding structure or by changing charge state of the defect or a combination of these effects, the recombination of carriers is reduced and carrier collection and power conversion efficiency is partially restored.

It is well known that lithium (Li) is a fast diffusing element in silicon and it interacts with dopants, impurities, defects and defect clusters in silicon lattice. See for example U.S. Pat. No. 4,608,452, incorporated herein by reference. These interactions are reversible and have specific reaction rates; even at room temperature (25° C.) there is significant movement and interaction of lithium inside the silicon devices. Li exists as a positively charged interstitial atom ($Li^+$) in the lattice, it is a shallow donor impurity (0.033 eV below silicon conduction band) and interacts with other species (such as phosphorus, which is an acceptor impurity, by binding to it and de-activating it). This has been used to deactivate and compensate dopants in silicon detectors for high energy physics so that large volumes of silicon can be depleted and high energy radiation particles measured as a result. In silicon solar cells for space applications, lithium has been used to passivate radiation induced defects and therefore recover power conversion efficiency of those cells.

SUMMARY OF THE INVENTION (DISCLOSURE OF THE INVENTION)

An embodiment of the present invention is a method of annealing a deployed solar cell array comprising solar cells comprising lithium, the method comprising: orienting the solar cell array toward the sun; open-circuiting a first portion of the array, thereby raising the temperature of the first portion; and annealing the first portion of the array to remove defects in the first portion. The method preferably further comprises operating a second portion of the array during the annealing step. The method preferably further comprises open-circuiting a second portion of the array and annealing the second portion, and preferably comprises selecting which portion to open-circuit and anneal by a procedure selected from the group consisting of a fixed algorithm, a command, an embedded artificial intelligence system, and an artificial neural network. The method preferably further comprises flowing additional current through the solar cells and/or embedded resistors or heaters in the first portion of the array in order to further increase the temperature of the first portion. Flowing additional current through the solar cells preferably comprises applying current to the solar cells in a forward bias direction or a reverse bias direction. The flowing step preferably is performed when the solar cells are in darkness or are exposed to light. The solar cells are preferably configured to have minimal or no reverse bias and reverse bias breakdown sensitivity, in which case the current is preferably applied to the cells in the reverse bias direction. The method optionally further comprises shining a light source on the first portion of the array in order to further raise the temperature of the first portion, wherein the light source is can be on a same spacecraft as the solar array, on another spacecraft, on the ground, or on another celestial body, and the light source preferably comprises as a laser, an LED, or a monochromatic light source. The defects can be manufacturing-induced or produced by radiation exposure. The array preferably comprises a transparent cover to at least partially protect the array from radiation. The cover preferably comprises a material selected from the group consisting of radiation resistant glass, a polymeric/glass hybrid, a polymeric thin metal hybrid, a thin film, and a polymer. The cover is optionally continuous or alternatively segmented, each segment covering a subset of the solar cells in the array.

An embodiment of the present invention is a method of controlling the location of ions in a solar cell, the method comprising: adjusting an electric field between a first conducting layer approximately at a first surface of the solar cell and a second conducting layer approximately at a second surface of the solar cell; and moving the ions between the first conducting layer and the second conducting layer. The first conducting layer is preferably embedded at or below the first surface and the second conducting layer is preferably embedded at or above the second surface. The first conducting layer and second conducting layer optionally comprise cover layers of the solar cell. At least one of the cover layers is preferably transparent and preferably at least partially protects the solar cell from radiation. The at least one cover layer preferably comprises a material selected from the group consisting of radiation resistant glass, a polymeric/glass hybrid, a polymeric thin metal hybrid, a thin film, and a polymer. The at least one cover layer optionally is a segment of a cover layer covering a solar array including the solar cell, the segment covering a subset of solar cells in the array, or alternatively is a continuous layer over all solar cells in a solar cell array including the solar cell. The ions are preferably lithium ions. The first conducting layer and second conducting layer preferably discharge induced and trapped charges and neutralize embedded charges in the insulating layers in the solar cell. The method is preferably performed so the ions are in desired locations in the solar cell prior to use of the solar cell. The first conducting layer and second conducting layer optionally comprise external electrodes temporarily placed on the solar cell.

An embodiment of the present invention is a solar cell comprising a first conductive layer approximately at a first surface of the solar cell, a second conducting layer approximately at a second surface of the solar cell, a plurality of ions, and a voltage controller for applying a first voltage to the first conductive layer and a second voltage to the second conductive layer, thereby producing an electric field between the layers to move the ions. The first conducting layer is preferably embedded at or below the first surface and the second conducting layer is preferably embedded at or above the second surface. The first conducting layer and second conducting layer optionally comprise cover layers of the solar cell. At least one of the cover layers is preferably transparent and preferably at least partially protects the solar cell from radiation. The at least one cover layer preferably comprises a material selected from the group consisting of radiation resistant glass, a polymeric/glass hybrid, a polymeric thin metal hybrid, a thin film, and a polymer. The at least one cover layer is optionally a segment of a cover layer covering a solar array including the solar cell, the segment covering a subset of solar cells in the array, or alternatively is a continuous layer over all solar cells in a solar cell array including the solar cell. The ions are preferably lithium ions and preferably are in desired locations in the solar cell prior to use of the solar cell. At least one of the first conducting layer and second conducting layer is preferably transparent and/or preferably comprises indium tin oxide (ITO) or aluminum zinc oxide (AZO). The solar cell preferably comprises an embedded resistor or heater.

An embodiment of the present invention is also a method of incorporating lithium into a solar cell, the method comprising: including lithium and at least one other element as impurities during growth of a silicon wafer to be manufactured into a solar cell; and interacting the lithium with the other element; wherein the amount of lithium in the solar cell is greater than a solubility limit of lithium in silicon. The interacting step preferably comprises binding the lithium to the other element. The other element preferably comprises fluorine, boron, or phosphorus. The relative amounts of lithium and the other element are preferably chosen so that a desired concentration of lithium in the silicon is achieved without causing unwanted crystal imperfections. The concentration of lithium in the silicon wafer is preferably greater than approximately $10^{14}$.

An embodiment of the present invention is a method of incorporating lithium into a solar cell, the method comprising: depositing a material comprising lithium and an impurity on a silicon wafer to be manufactured into the solar cell; diffusing the lithium and the impurity from the material into the silicon wafer; interacting the lithium and the impurity; and a dopant in the material forming alloyed n+ and/or p+ junctions in the silicon wafer. The material preferably comprises a paste comprising silica glass and metallic components. The material is optionally screen printed on the silicon wafer. The material optionally consists essentially of metallic lithium. The method optionally further comprises removing the material after the diffusing step. The interacting step preferably comprises binding the lithium to the impurity. The relative amounts of lithium and the impurity in the material are chosen so that a desired concentration of lithium in the silicon is achieved without causing unwanted crystal imperfections. The method preferably comprises incorporating lithium into the silicon wafer at a higher concentration than a solubility limit of lithium in silicon without substantially changing electrical functionality of doped regions in the silicon wafer. The impurity optionally comprises fluorine, boron, or phosphorus. When the silicon wafer is n-type the dopant preferably comprises boron. The impurity and the dopant are optionally the same element. The method preferably comprises permanently leaving the material on the silicon wafer, wherein the material acts as a source of lithium after the junction formation step. Concentrations of the lithium and the dopant in the material are preferably chosen so that a desired concentration of lithium in the silicon wafer is achieved throughout the operation of the solar cell. The desired concentration of lithium in the silicon wafer optionally changes during operation of the solar cell, for example increasing during operation of the solar cell. The material preferably acts as a controlled source and sink for lithium atoms during operation of the solar cell.

An embodiment of the present invention is a multijunction solar cell comprising a silicon and perovskite tandem junction, the solar cell comprising a lithium-doped silicon cell as one of the junctions; and a perovskite cell disposed on the silicon solar cell as the other junction. The solar cell preferably has an efficiency greater than approximately 30%, and the efficiency is preferably maintained until the end-of-life of the solar cell. The solar cell preferably comprises a passivation layer between the silicon cell and perovskite cell to prevent lithium from diffusing from the silicon cell into the perovskite cell. The passivation layer preferably comprises silicon nitride or alumina ($Al_2O_3$). The solar cell optionally comprises diffusion blocking regions for controlling or eliminating lithium movement in the solar cell. The silicon cell and/or the perovskite cell preferably has excess current to accommodate changes in behavior during operation of the solar cell.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the figures.

DETAILED DESCRIPTION OF EMBODIMENTS OF THE INVENTION

Figure 1A:
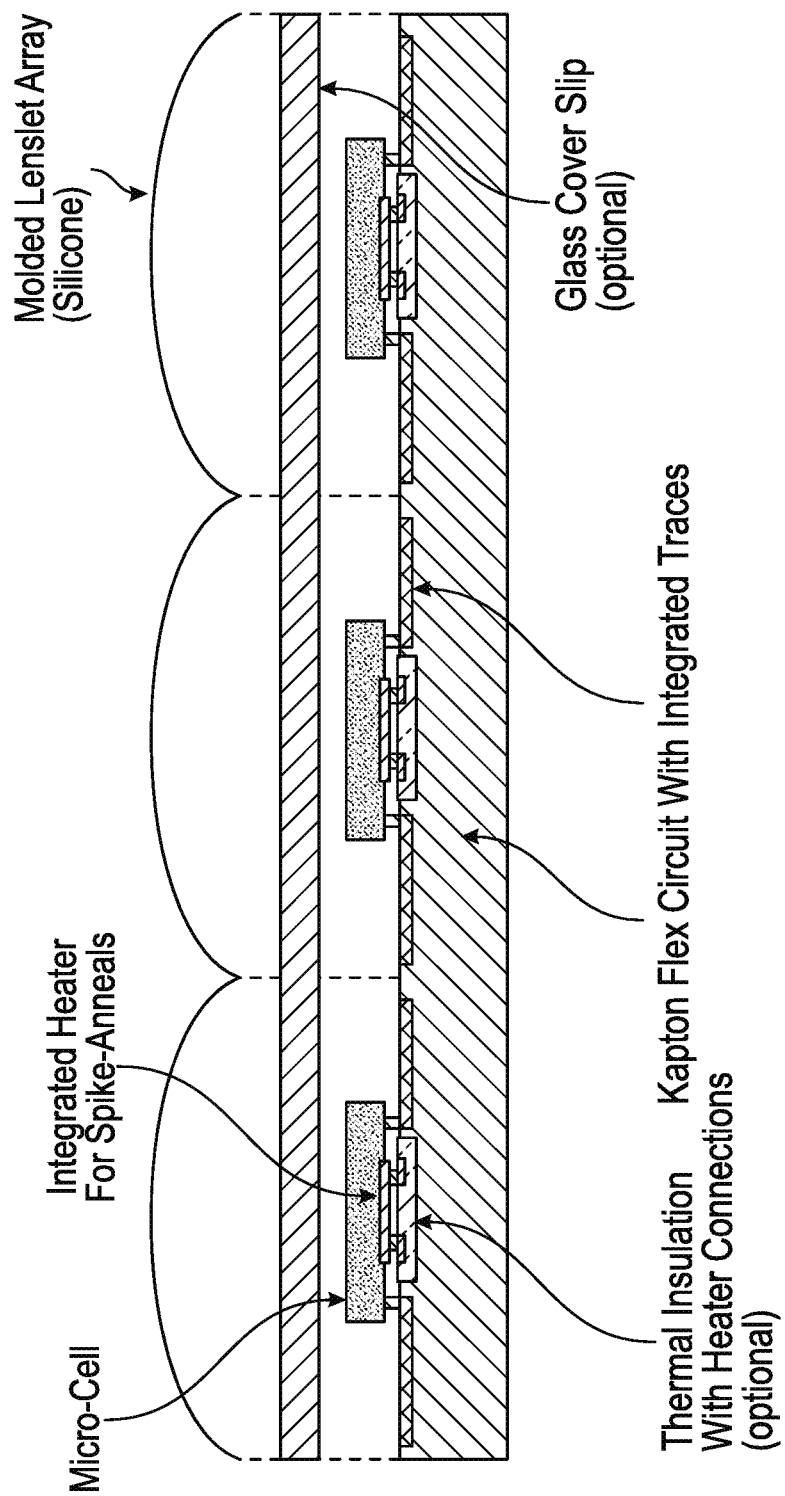
FIGS. 1A-1B show a schematic of the present invention comprising micro-cells, a concentrator apparatus, a receiving substrate and integrated heater element(s).

Annealing of solar cells in accordance with the present invention can be done in a short period of time, such as several seconds to several minutes, depending on the response of the cells. Hydrogen passivation of defects is an important mechanism well known in the integrated circuit industry, and can occur rapidly in the silicon/silicon dioxide system owing to the fast diffusion of hydrogen in these materials. Silicon nitride is known to block hydrogen diffusion, which is also used as a passivation/anti-reflection coating layer around the cell. This allows a reservoir of hydrogen to remain within and close to the cell, along with hydrogen rich plasma deposited oxide layers that are integrated in the cell structure during processing of the cells. Repeated annealing steps after a prescribed operation duration are preferably then used to recover efficiency multiple times, providing increased energy production throughout the mission life for the system.

This approach has important benefits in deep space applications and other near-earth, Mars mission scenarios. Especially in low-intensity, low temperature (LILT) and extreme radiation environments seen around Jupiter, or other space missions such as the ones traversing the Van Allen belts or staying in the belts for extended periods of time, having the ability to recover lost efficiency is critical for extending mission durations and increasing system capabilities.

Incorporation of Lithium into Silicon Device

There are numerous ways of introducing lithium into a silicon device. Various combinations of these methods can be leveraged to achieve the optimum performance of the device, for example, to recover and maintain maximum possible power generation capability of solar cells in a space radiation environment.

In one embodiment, it is possible to include lithium as an intentional impurity in crystal growth process, such as Czochralski (CZ) crystal growth or float zone (FZ) crystal growth. Lithium will bind and interact with oxygen and other impurities during these processes, so it is critical to engineer the precise concentrations and reactions desired to achieve a uniform Li concentration within the resulting silicon ingot without causing unwanted crystal imperfections. At room temperature, solid solubility of Li in pure silicon is around $10^{12}$ atoms/cm$^3$; depending on the concentration of other elements such as phosphorus, oxygen, boron, etc. This solubility limit increases as lithium reacts and binds with these elements. It is preferable for the Li concentration to be on the order of approximately $10^{14}$-$5\times10^{15}$/cm$^3$ to continually passivate defects that are generated by exposure to the radiation environment. As the crystal cools down, excess Li could segregate to boundaries and surfaces which can be managed by removal or modification of those boundaries and surfaces before further processing of the material.

In another embodiment, it is possible to introduce Li into silicon by ion implantation. This is commonly done with many dopants in silicon microelectronics, and increasingly in solar cell, manufacturing. Since Li is preferably uniformly distributed throughout the silicon device, this implant step can be done as a blanket implant, without any necessary masking layers on the device or masks in the implant tool. It is also possible to perform masked implantation to concentrate Li in preferred regions of the device as an initial condition; however, after subsequent annealing steps, which typically will be above 600° C. for 10 to 60 minutes to remove all of the implant induced damage in the silicon crystal, Li will redistribute throughout the silicon crystal mostly uniformly. It is possible to engineer regions of higher Li concentration, if desired, by having other impurities such as phosphorus in those regions, since Li will preferentially bind to those impurities. Such doped regions are also commonly used as junctions and contact regions for solar cells, therefore the concentration and effects of Li on those regions are carefully designed to achieve the desired device and system functionality. Li implantation can be done in early stages of the processing, or it can also be performed at the end of the process, after all the passivation, junction formation and metallization steps have been performed. With an all-back contact cell (interdigitated back contact or point contact cell), the Li implant can be done from the side without any metallization ('sunny side') with high enough energy to have Li atoms stop within the silicon (for example, about 0.1-10 microns below the surface with silicon nitride passivation). A subsequent anneal at 600° C. will remove all the implant damage and distribute Li throughout the silicon lattice, without any adverse effects on the junctions, passivation layers and metallization layers, since those are formed at even higher temperatures and can tolerate this anneal and diffusion step. There will not be any significant movement of the dopant atoms in the junctions since they usually require temperatures above 750° C. to diffuse appreciably.

In another embodiment, it is possible to deposit a Li containing mixture, such as glass frit or paste formulation, on a silicon wafer and diffuse the Li into the silicon wafer by a thermal diffusion step. This Li containing layer can then be removed and subsequent device processing steps can be performed. In other embodiments, this can be performed by screen printing, or even directly depositing metallic lithium on the surface of the silicon and diffusing it into the silicon.

In another embodiment, it is possible to deposit metallic and glass frit combination pastes with Li incorporated in them. These pastes are used to form junctions in silicon by etching the combination of elements in the paste through the insulating layer (such as silicon nitride or silicon dioxide) at elevated temperature (800° C. and above) and form alloyed (e.g. n+ or p+) junctions in the single crystal silicon. By incorporating Li into the glass frit or into other components of this paste, simultaneous introduction of Li is possible. This also has the added feature of acting as a constant source of Li after the junction formation step, since this material is preferably left on the wafer and the device as a permanent part of the final device. The reaction rates of Li with other elements in the paste can be engineered to have a desired concentration of Li available to diffuse into silicon throughout the operation of the device, since it is possible to start with a lower level of defects in silicon (for example, at the beginning-of-life or 'BOL' stage of a spacecraft) and have an increasing level of defects as the device is exposed to the radiation environment (towards the end-of-life or 'EOL' stage of a spacecraft). The elements and the reactions in the paste can be adjusted so the paste acts as a controlled source and sink for Li atoms throughout the operational range of the device.

In terrestrial applications, Li can also be utilized to compensate for defects that cause degradation in cell performance due to interactions among those defects and silicon lattice during operation of the cells. While there is no expected radiation exposure for terrestrial solar applications, interactions between impurities in the cells (for example, boron and oxygen) lead to electrically active defects that reduce the efficiency of the cells. These degradation mechanisms have been termed light induced degradation (LID), temperature induced degradation (TID), light and elevated temperature induced degradation (LeTID), etc. Li is an active entity in the cells that binds and deactivates or otherwise changes the reaction and activity of these defects and defect complexes.

Although the above descriptions of the solar cell comprise doped junctions as an example, solar cells formed with heterojunctions (using undoped-doped amorphous silicon or tunnel junction-metal contacts) work equally well with the described annealing characteristics. Also, the substrate doping of the cell could be n type or p type, and the observed efficiency and annealing behavior can be adjusted by the appropriate Li concentration, dopant and other impurity concentrations in the cell structure. For example, in high efficiency n-type substrate silicon solar cells, a background doping of boron (which is a p-type dopant) can be incorporated at a 10×, 50× or 100× lower concentration than an n-type substrate doping level ($1e^{14}$-$1e^{15}$/cm$^3$ of boron, with $1e^{16}$ of phosphorus doping). In this case Li can bind to boron and can be incorporated into the cell at higher concentrations without causing the doped regions (substrate, junctions, surface regions, etc.) from changing significantly in their electrical functionality. This could also be accomplished by adding other atoms into the silicon cell in desired concentrations that enable Li to be accommodated in the cell.

In another embodiment, a multi-junction device, such as a silicon and perovskite tandem junction, is built using a Li doped silicon cell as one of the junctions and a perovskite cell as the other junction. Perovskite cells are inherently radiation resistant and very thin (on the order of 1 micrometer to several micrometers in thickness) and, with the efficiency recovery provided by Li in silicon, the combined structure is also very radiation resistant. This structure will also provide higher overall efficiency on the order of 30% or higher, compared to mid-20% efficiency for a silicon only cell. The high conversion efficiency of 30% or higher will also be maintained to the EOL of the mission, given the inherent radiation resilience of a perovskite cell and the recovery capability of a silicon cell with Li inside the cell structure. The silicon nitride and/or alumina ($Al_2O_3$) passivation layers on top of the silicon cell will prevent Li from diffusing from the silicon cell into the perovskite cell and additional diffusion blocking layers can be built and structured in the tandem cell as needed through deposited, patterned and etched regions if Li movement in the structure needs to be controlled or eliminated. Depending on cell behavior during radiation exposure, it is also possible to set up the junction currents (controlled by absorbing and collecting layer thicknesses in the cells) so that the overall highest possible efficiency is maintained. For example, a silicon cell can be constructed to have excess current or a perovskite cell can be constructed to have excess current to accommodate changes in cell behavior during operation. Perovskite cells are very sensitive to water vapor intrusion and need to be very well passivated, which is preferably provided by deposited and patterned layers of silicon nitride and/or alumina in our combined silicon/perovskite cell process with embedded Li.

Operation of the Device and System

Once devices of the present invention are fabricated with the desired concentration and distribution of Li inside the silicon device, these devices are assembled and integrated into solar modules and arrays that are then preferably deployed on a satellite or other systems (in orbit, in transit or as landed systems) to generate power in desired locations. While in certain cases these systems will experience temperatures in the 25° C. to 150° C. range in which Li is very mobile, there are other cases such as deep space missions or locations with large amounts of shade (in eclipse or in shadow of local features) that could have very low temperatures (−150° C. or lower), where Li will not be as mobile.

In warmer temperature ranges, it will be possible to orient the devices and the solar array towards the sun and 'open-circuit' the whole array or portions of the array, which will cause the temperature of the array to raise to even higher temperatures. For example, if the array (and the embedded solar cells) are operating at 65° C. while power is being harvested from the array, in the open-circuit condition, where no power is being drawn from the array or portion of the array, the temperature of the structure can rise to approximately 125-150° C. This can be performed while the spacecraft is over regions where there is lower demand for power in the rest of the system, and the portions of the array that are being 'open-circuited' can be cycled to achieve uniform recovery of efficiency with the enhanced diffusion of Li in the solar cells. Selection of which portions of the array to be annealed with the open-circuit method can be a fixed algorithm, or it can be modified by commands from the ground, or controlled by an embedded artificial intelligence system such as an artificial neural network that can either learn the optimum sequence on the spacecraft or have the neural network trained in another system (either in orbit or on the ground) and have the resulting configuration uploaded to a prediction (inference) engine on the spacecraft. The data to train this network can be generated on each individual spacecraft or by looking at a section of the constellation or by looking at the complete constellation.

In cases where the temperature increase caused by simply open-circuiting the array or portions of the array while it is pointing at the sun is not sufficient to achieve the desired annealing of defects, it is possible to flow additional current through the cells or through the embedded resistors to increase the temperature and achieve the desired annealing. It is also possible to direct a light source such as a laser, LED, or other preferably monochromatic light source to the array or portions of the array while these regions are in open-circuit condition to further raise the temperature of the cells. This light source could be on the same spacecraft, on another spacecraft or it could be on the ground or on another celestial body.

In certain cases, it might be desirable to perform the annealing process in the dark. Presence of photogenerated or electrically driven carriers in the cell and presence of certain wavelengths of light can enhance or inhibit certain reactions between Li and other impurities, dopants, defects and/or defect clusters. With the array in the dark, it is possible to selectively deplete the device so there are no or minimal carriers, shine specific wavelengths of light onto the array and/or flow the desired amount of current to achieve the desired results.

In another embodiment, a controlled distribution of Li atoms can be achieved by imposing an electrical field across the device. Since Li is positively charged when in the silicon lattice, lithium atoms will drift under the influence of the applied field. The desired electrical field can be generated by applying voltages to thin, transparent conducting films in the solar array stack on the light input side ('sunny-side'), such as indium tin oxide (ITO) or aluminum zinc oxide (AZO) films or other similar layers, or to other non-transparent conducting layers such as copper or conductive polyimide on the non-light input side of the stack. It is also possible to include transparent conducting layers on both the front (light input side) and the back side of the solar array stack. In certain instances, layers in the solar array stack can also charge up and form an electric field due to the particles that are impinging on the array. It is possible to use this field to help aid in the drift of Li atoms, and if this field is causing undesired concentration of Li on one location, the embedded conductive layers can be configured to apply a field in the opposite direction to counteract this effect. The repeated cycling of the field with applied voltages could also have the additional beneficial effect of reducing charging effects in the solar array structure and avoid possible arcing that is caused by such charging phenomena. Increased temperature during the application of the desired fields to the array is also beneficial in making Li atoms more mobile and potentially neutralizing the embedded charge in the insulating layers in the solar array stack.

Figure 1B:
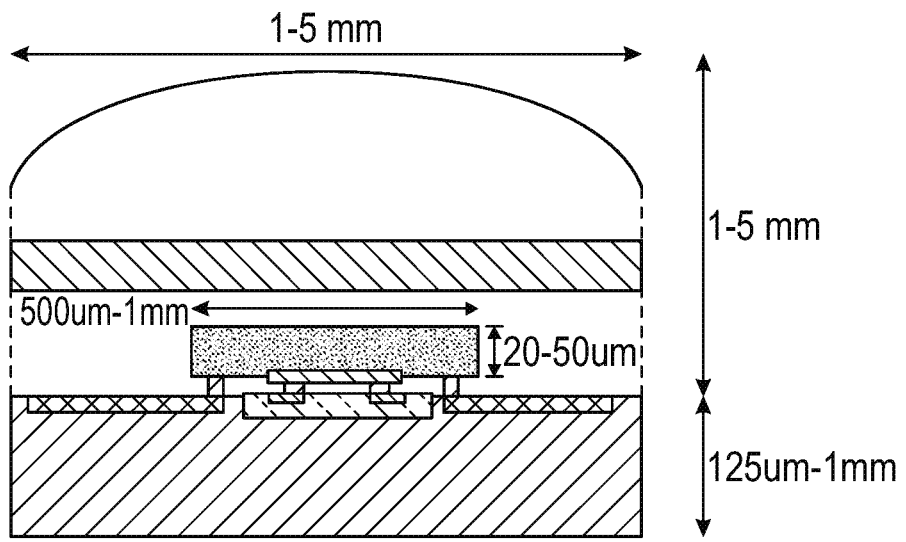
Figure 1C:
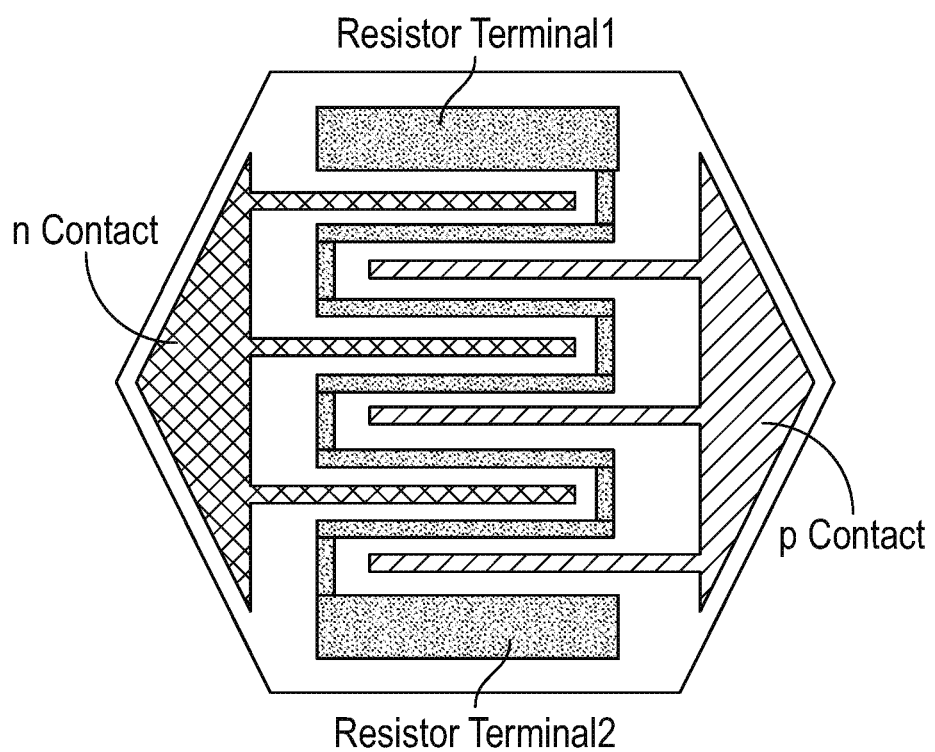
FIG. 1C is an exemplary top view.

FIGS. 1A-1B are a schematic representation of an embodiment of the present invention comprising solar cells, a light concentrating apparatus, a receiving layer (flexible circuit), and an optional thermal management layer. FIG. 1C is a top view of a possible cell design. The cells are fabricated and assembled onto the receiving circuit. The thermal management layer comprising thermal insulation allows the thermal resistance between the cell and other materials to be controlled. Electrical connections between the n and p terminals of the cell and the power collection circuit can be made with solder, conductive epoxy, deposited thin films, or any other suitable method. The heater on or near each cell is also connected to a thermal management circuit using similar means. The heater shape is preferably designed to deposit maximum thermal energy into the semiconductor material and minimize heating of other elements in the system. In cases where a nominal operation temperature for the cell is desired, pulses of currents or a steady current can be used to maintain the desired temperature.

Figure 2:
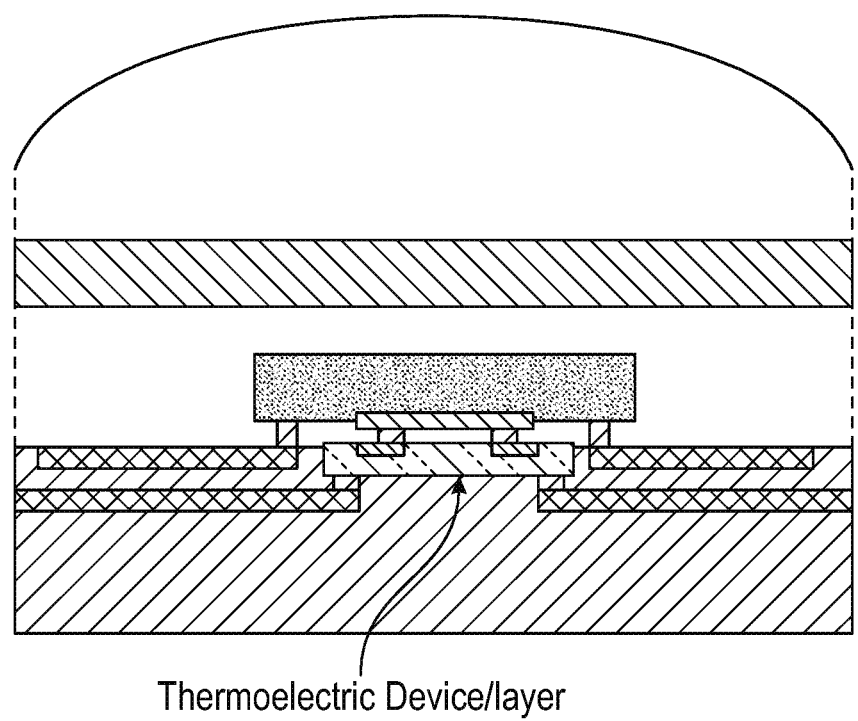
FIG. 2 shows an alternative embodiment where there are active thermal management elements integrated into the system.

FIG. 2 is a schematic representation of an active thermal management system where a device such as a thermoelectric device or layer is integrated into the system. This enables active alteration of the thermal path between the cell and surrounding materials. This configuration can also be used to maintain the desired constant temperature at the cell with reduced heater current and additional power dissipation in the thermoelectric device.

Figure 3:
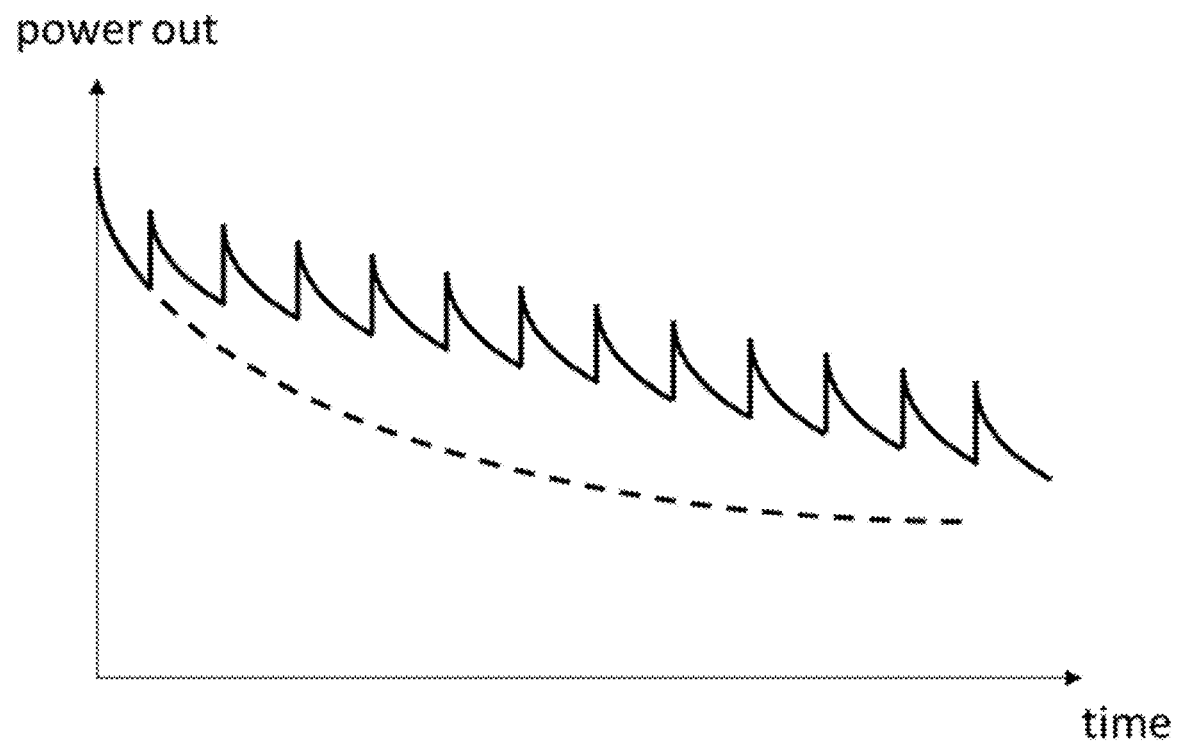
FIG. 3 shows enhanced energy production due to multiple annealing cycles.

FIG. 3 shows a plot of the enhanced energy production using spike anneals. The dashed line shows the asymptotic reduction in energy production due to the accumulation of damage in the cell. The solid line shows multiple periodic spike anneals, which enhance energy production. While the accumulation of damage is not preventable, annealing of the defects is achieved due to the thermal energy provided to the cells. Even with the anneals, there is an accumulation of damage that continues to degrade the output from the cells, though to a lesser extent.

Figure 4:
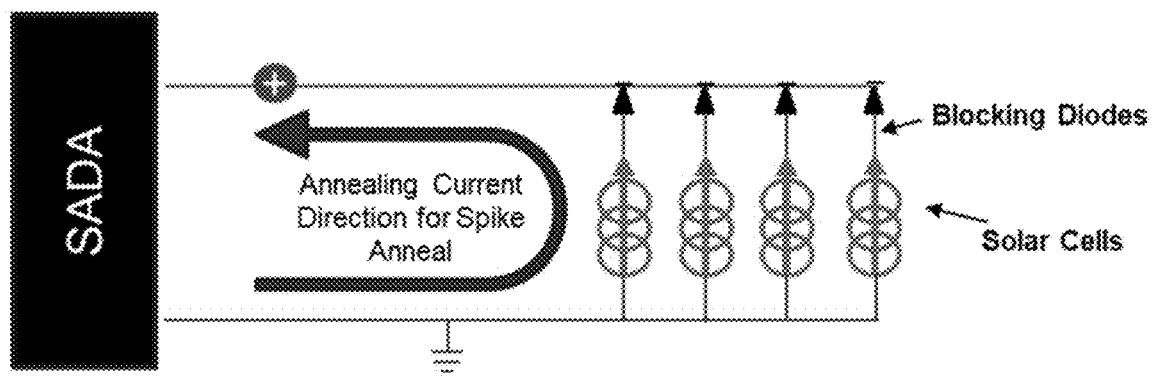
FIG. 4 shows spike anneal being applied to solar cells directly.

FIG. 4 shows the spike anneal current direction applied directly to the solar cells during operations using electrical connections.

Figure 5A:
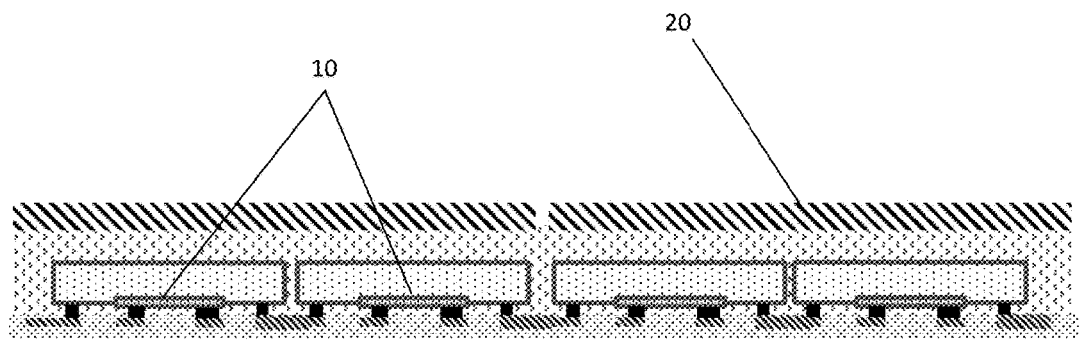
FIGS. 5A-5C show a solar array without concentrating optics.
Figure 5B:
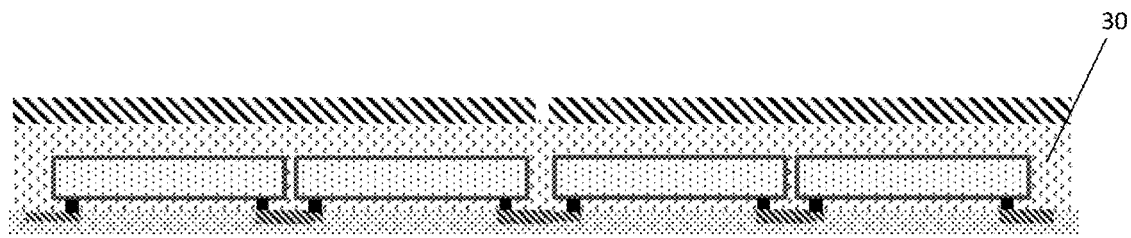
Figure 5C:
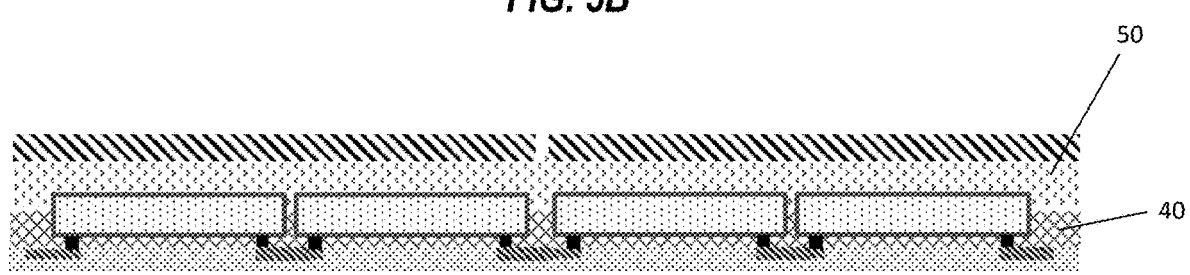

FIGS. 5A-5C show three solar array configurations where no concentrating optics are used. Such an array could be assembled with very high fill factor (active area with solar cells divided by total area of the solar array), reaching as high as about 97-99%. FIG. 5A shows an array comprising integrated heaters 10 on the cells. Cover layer 20 that optionally comprises radiation resistant glass, a polymeric/glass hybrid, or a polymeric thin metal hybrid cover is also shown as a segmented assembly over the cells. This cover layer preferably protects the solar cell from radiation and can extend over small groupings of cells or could cover large areas depending on the mechanical requirements and flexibility of the array and deployment mechanism that is desired. In some embodiments the cover layer may comprise a thin film and/or be polymeric, and is continuous and not segmented. FIG. 5B shows an array where the cells are directly driven by forward or reverse bias to achieve the desired temperature increase and annealing. Encapsulation layer 30 between cover layer 20 and cells preferably comprises a single layer that fills both under the cells and above the cells. Alternatively, as shown in FIG. 5C, the array can comprise a multi-layer encapsulation with first encapsulation material 40 that is disposed approximately under the cells and a layer of second encapsulation material 50 that is disposed approximately above the cells to provide desired mechanical properties (such as matched thermal expansion coefficients), electrical properties (for example, insulating), thermal properties (e.g. thermally insulating or conductive), and/or optical properties (for example, transparent or opaque).

Figure 6:
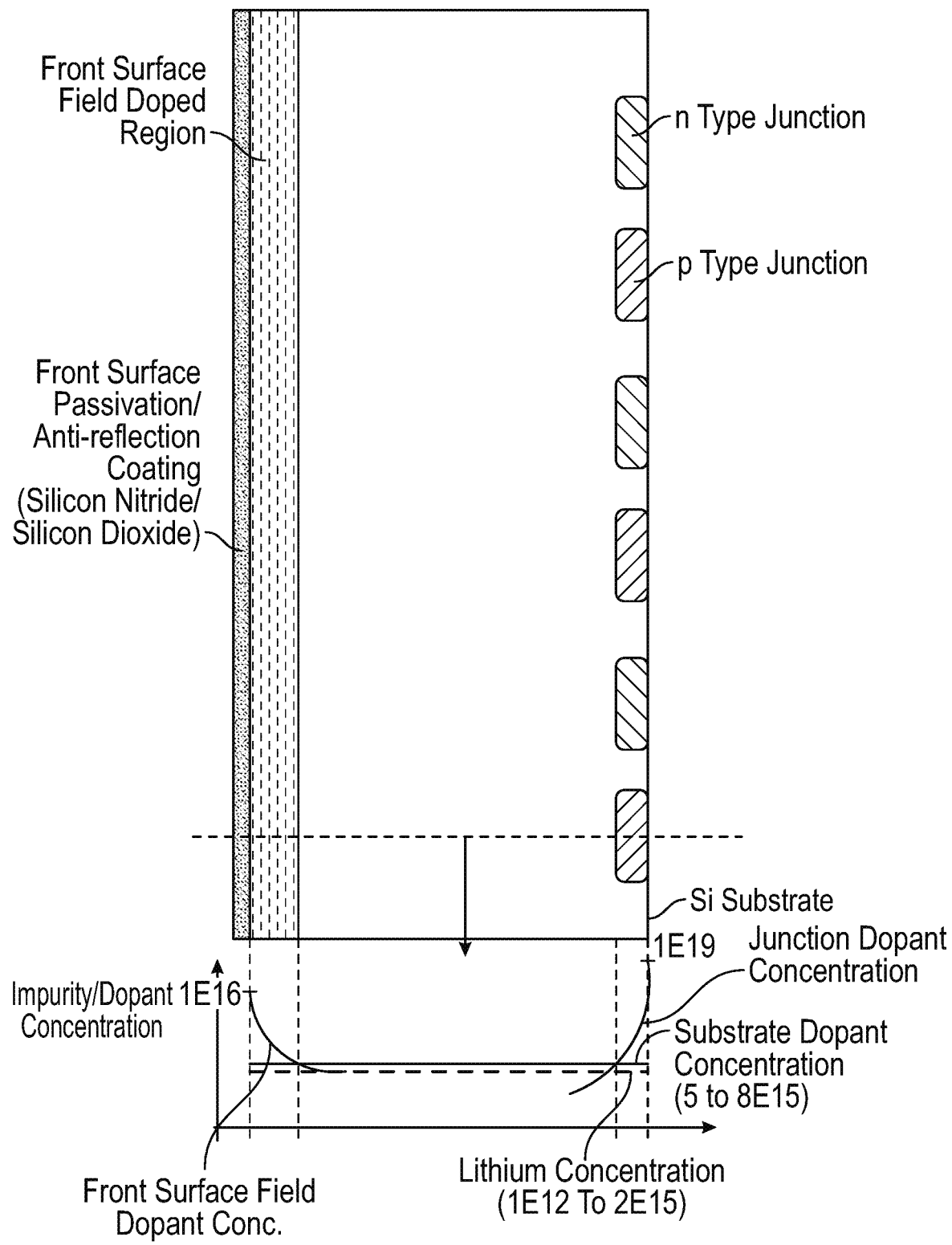
FIG. 6 shows a nominal solar cell structure with Li and dopant concentrations.

FIG. 6 shows a cross section of an example solar cell structure with doped junctions, front surface field, and constant lithium concentration throughout the structure. The desired Li concentration in the structure will be driven by the amount of damage expected by EOL and during the operational duration of the power generating system. Although Li is an n-type dopant, it is possible to adjust the device structure to accommodate the varying doping levels by making the substrate and doped junction concentrations higher than the Li concentration so no significant changes in device characteristics, such as substrate type flip or undesirably high resistance in portions of the device due to lowered dopant concentrations, are observed. For clarity, surface texture for light management, metal traces, insulators and other features in the cell structure are not shown in this figure.

Figure 7:
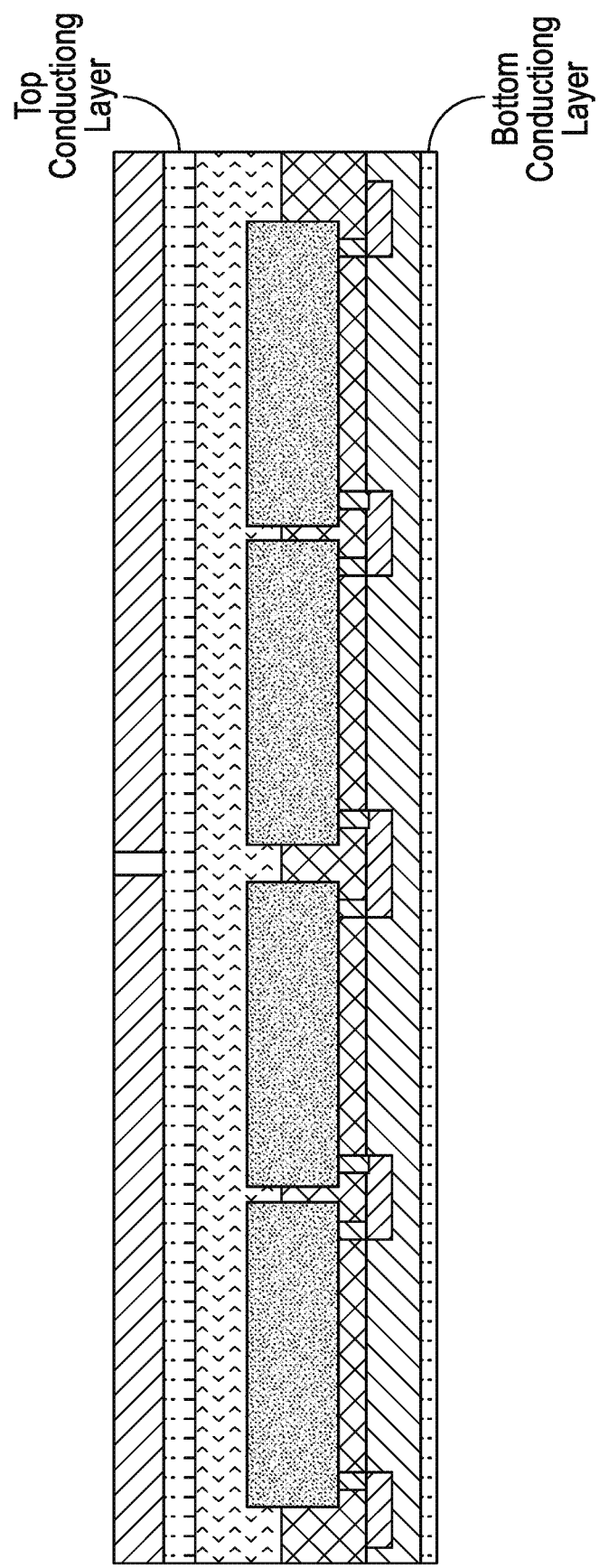
FIG. 7 shows embedded conducting layers for applying electric fields across a cell or across a portion of the array.

FIG. 7 shows a solar cell stack with examples of embedded conducting layers that allow application of desired electrical fields across the structure to enhance motion of Li throughout the cell structure. These conductive layers could be embedded in or deposited on the other layers in the structure such as the top cover, bottom cover or intermediate assembly layers. They are connected to the system control mechanism that can apply the desired voltages and monitor currents to insure proper operation of the system. These layers can also assist in discharging some of the induced and trapped charge in the stack due to radiation exposure. Higher temperatures during annealing of the cells will be beneficial in increasing the mobility, removal and compensation of these trapped charges. This process can be used to pre-condition the cells and/or the array so that the lithium is in a desired location prior to the array being put into use. This pre-conditioning can alternatively be performed by placing external electrodes on the array instead of the embedded layers described above.

An embodiment of the present invention is minimizing the amount of semiconductor material through the use of optical concentration. A small solar cell, on the order of several hundred microns to several millimeters across and 10-150 microns thick, is assembled on a receiver array. Optical elements, such as those that are reflective, refractive, diffractive or a combination of these, are used to concentrate the incoming light onto the cell. Another configuration of the solar array is generated when the cells are assembled onto a receiving array without the optical concentration elements. This cell could be a single junction single crystal silicon cell, a multi-junction compound semiconductor cell or a combination of the two. By proper selection of the optical designs, acceptance angle is maximized which allows the solar array to receive light even if it is not in perfect alignment with the sun. This simplifies the tracking requirements for the array and allows energy harvesting in unexpected conditions where there might be significant misalignment of the solar arrays and sun. The concentrating system and small physical size of the solar cells also allow the in-situ, in-operation annealing of the solar cells to be performed with minimal energy input. The thermal mass of the cells are much smaller than a 1-sun panel configuration and the thermal environment of the cell can be readily managed by materials selection and integration of other active elements to further reduce the thermal energy needed to reach the desired higher temperatures (100° C. to 400° C. range) for the cell while minimizing temperature increases in other components.

While the small cells provide a benefit in improved thermal characteristics, it is also possible to achieve desired annealing behavior on larger scale (macro) cells, for example those ranging from several cm to 15 cm in each lateral dimension. The thermal energy is preferably delivered to the cell by means of an integrated heater, which is patterned on the cell or very close to the cell in the receiving assembly. The heater resistance is preferably selected to deposit the maximum amount of thermal energy in the cell and minimize heat generation in other sections of the system. This is preferably achieved by having a large resistance on or close to the cell for heating and a small resistance in the rest of the circuit. To simplify operation, one or more resistors are preferably placed in series and a current is placed across the circuit. To drive the necessary current across this arrangement of resistors, a high voltage and medium amount of current is desirable rather than a low voltage and high current. The solar cell assembly is preferably configured to provide this high voltage/medium current and associated power and thermal management circuitry is utilized to route the power and manage the annealing process. During the annealing, it might be desirable to have a voltage across the cells, or have the cells floating, and have the cells with light incident on them or in the dark, which is also managed by the annealing control system. Dark annealing condition is achieved by pointing the section of the array away from the sun during this step, or carrying out the procedure when the spacecraft is in eclipse to avoid having to rotate the arrays.

Thermal management of the region around the solar cell can be accomplished by passive or active means. In the passive case, the materials around the cell and connections to the radiators (other thermal management structures) are selected to achieve the desired thermal resistance path to allow nominal operating temperatures for the cell and minimize heat transfer out from the cell during the anneal step. This minimizes the amount of energy that needs to be used to reach the annealing temperature. In the active case, a thermally switchable element, for example a thermo-electric layer or device, is used to provide the desired thermal resistance connection to the rest of the system. This requires additional energy to be used, but it is still small compared to the additional energy harvested by the cell under improved efficiency conditions. Another active management option is a mechanically switched contact device, such as a MEMS mechanical switch, that can provide the high or low thermal resistance path.

Proper thermal management of the cells and the environment also enables precise and low energy control of the operational temperature of the cells. This is desirable for many reasons such as optimization of cell structures and elimination of unwanted power excursions up or down from the cells due to large temperature swings. Integrated heaters can also serve as temperature-sensing elements when voltage across them are measured using a low current. Control circuitry and embedded control elements in the array and/or in a central controller in the satellite perform the sensing and control functions for the desired system behavior.

Application of a current to the solar cells in the forward bias or reverse bias direction can be potentially carried out in two configurations, under illumination which will have the light generated current flowing through the cells, and in the dark, where only the applied heating current will be flowing through the cells. Presence of higher carrier concentrations due to the light generated carrier population has the advantage of enhancing annealing reactions that are supported by light driven reactions, recombination and/or carrier trapping and/or detrapping in certain defect locations, and a combination of such processes. The dark annealing configuration enables other annealing reactions that are better performed when there are no light driven reactions, and reduced levels of other recombination and/or trapping/detrapping related reactions and interactions are possible.

For the reverse bias direction, the cells are preferably specifically configured to have minimal or no reverse bias and reverse bias breakdown sensitivity. When a threshold reverse bias voltage level is exceeded, higher currents will flow through the solar cells with minimal or ideally with no performance degradation, which is nominally seen as a reverse bias dark current increase after the reverse bias breakdown. A certain amount of reverse bias dark current increase is tolerable and is expected to be seen in the space operational environment even without the reverse breakdown condition. The balancing of the reverse bias annealing conditions and resulting solar cell and array performance are preferably carried out using sensing mechanisms (such as current and/or voltage sensors) and algorithms built into the power management system.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A method of annealing a deployed solar cell array comprising solar cells comprising lithium, the method comprising:
   orienting the solar cell array toward the sun;
   open-circuiting a first portion of the array, thereby raising the temperature of the first portion; and
   annealing the first portion of the array to remove defects in the first portion.

2. The method of claim 1 further comprising operating a second portion of the array during the annealing step.

3. The method of claim 1 further comprising open-circuiting a second portion of the array and annealing the second portion.

4. The method of claim 3 comprising selecting which portion to open-circuit and anneal by a procedure selected from the group consisting of a fixed algorithm, a command, an embedded artificial intelligence system, and an artificial neural network.

5. The method of claim 1 further comprising flowing additional current through embedded resistors or heaters in the first portion of the array in order to further increase the temperature of the first portion.

6. The method of claim 5 wherein the flowing step is performed when the solar cells are in darkness or are exposed to light.

7. The method of claim 1 further comprising shining a light source on the first portion of the array in order to further raise the temperature of the first portion.

8. The method of claim 7 wherein the light source is on a same spacecraft as the solar array, on another spacecraft, on the ground, or on another celestial body.

9. The method of claim 7 wherein the light source comprises as a laser, an LED, or a monochromatic light source.

10. The method of claim 1 wherein the defects are manufacturing- induced and/or produced by radiation exposure.

11. The method of claim 1 wherein the array comprises a transparent cover to at least partially protect the array from radiation.

12. The method of claim 11 wherein the cover comprises a material selected from the group consisting of radiation resistant glass, a polymeric/glass hybrid, a polymeric thin metal hybrid, a thin film, and a polymer.

13. The method of claim 11 wherein the cover is segmented, each segment covering a subset of the solar cells in the array.

14. The method of claim 11 wherein the cover is continuous.

* * * * *